(12) United States Patent
Jones

(10) Patent No.: US 10,923,872 B2
(45) Date of Patent: Feb. 16, 2021

(54) TOOL FOR DISCONNECTING A CONNECTOR

(71) Applicant: Teradyne, Inc., North Reading, MA (US)

(72) Inventor: Randolph Taylor Jones, Gloucester, MA (US)

(73) Assignee: TERADYNE, INC., North Reading, MA (US)

( * ) Notice: Subject to any disclaimer, the term of this patent is extended or adjusted under 35 U.S.C. 154(b) by 268 days.

(21) Appl. No.: 15/993,978

(22) Filed: May 31, 2018

(65) Prior Publication Data

US 2019/0372293 A1 Dec. 5, 2019

(51) Int. Cl.
| | | |
|---|---|---|
| *B23P 19/00* | (2006.01) | |
| *H01R 43/26* | (2006.01) | |
| *H01R 13/635* | (2006.01) | |
| *H01R 43/20* | (2006.01) | |
| *H01R 24/50* | (2011.01) | |
| *H05K 7/14* | (2006.01) | |

(52) U.S. Cl.
CPC ........... *H01R 43/26* (2013.01); *H01R 13/635* (2013.01); *H01R 24/50* (2013.01); *H01R 43/205* (2013.01); *H05K 7/1415* (2013.01)

(58) Field of Classification Search
CPC ...... H01R 43/26; H01R 24/50; H01R 16/635; H01R 43/205; H05K 7/1415
See application file for complete search history.

(56) References Cited

U.S. PATENT DOCUMENTS

| | | | | |
|---|---|---|---|---|
| 1,122,165 A | * | 12/1914 | Schoening | B25B 27/205 81/302 |
| 4,280,265 A | * | 7/1981 | Murphy | B25B 27/205 29/229 |
| 6,697,022 B2 | * | 2/2004 | Ponce De Leon | H01Q 1/243 343/702 |
| 9,622,732 B2 | * | 4/2017 | Martinelli | A61B 5/0488 |
| 2013/0012999 A1 | * | 1/2013 | Petit | A61B 17/7076 606/279 |
| 2018/0161028 A1 | * | 6/2018 | Bosshard | A61B 17/3201 |
| 2019/0008564 A1 | * | 1/2019 | Beyer | B25B 27/205 |

OTHER PUBLICATIONS

SMP Connectors Power Point, 4 pages (created Apr. 25, 2018, but not published).

* cited by examiner

*Primary Examiner* — Paul D Kim

(74) *Attorney, Agent, or Firm* — Burns & Levinson LLP

(57) ABSTRACT

An example tool for disconnecting a connector from a circuit board includes: a first arm having first handle and a first notch, where the first notch is for engaging a first connector connected to the circuit board; and a second arm having a second handle and a second notch, where the second notch is for engaging a second connector connected to a cable. A hinge connects the first arm to the second arm. The hinge is biased so that, when the tool is not in use, the first handle and the second handle are farther apart than are the first notch and the second notch.

20 Claims, 7 Drawing Sheets

TOOL FOR DISCONNECTING A CONNECTOR

TECHNICAL FIELD

This specification relates generally to a tool for disconnecting a connector from a circuit board and thereby removing a cable from the circuit board.

BACKGROUND

A sub-miniature push-on (SMP) connector connects an electrical cable to a receptacle connector. The receptacle connector may be on a circuit board or electronic device. The SMP connector connects to the receptacle connector through application of force. For example, to create the connection, the SMP connected is pushed into the receptacle connector. The resulting physical connection creates an electrical connection that allows electrical signals to flow between the circuit board and the cable.

SUMMARY

An example tool for disconnecting a connector from a circuit board comprises: a first arm comprising first handle and a first notch, where the first notch is for engaging a first connector connected to the circuit board; and a second arm comprising a second handle and a second notch, where the second notch is for engaging a second connector connected to a cable. A hinge connects the first arm to the second arm. The hinge is biased so that, when the tool is not in use, the first handle and the second handle are farther apart than are the first notch and the second notch. The example tool may include one or more of the following features, either alone or in combination.

When the tool is not in use, the hinge may be biased so that the first handle and the second handle are apart and the first notch and the second notch are flush. The tool may be made of metal that is produced by a three-dimensional printing process.

The example tool may comprise a spring to bias the hinge. The spring may be wound around the hinge and may include fingers that contact, to bias, the first arm and the second arm. The first handle and the second handle may align longitudinally. The hinge may be located partway along the first arm and the second arm. The hinge may be between the first handle and the first notch and between the second handle and the second notch. The second notch may be configured to engage a groove in the second connector. A part of the first arm containing the first notch may be configured to remain flush against an edge of the circuit board when the first notch engages the first connector.

The first arm and the second arm may comprise structures containing holes that align. The hinge may comprise a shoulder screw and a retaining nut. The shoulder screw may be for fitting within the holes and the retaining nut may be for engaging the shoulder screw. The hinge may be biased so that, when the tool is in use, the first handle and the second handle move closer together and the first notch and the second notch move farther apart. Movement of the first notch and the second notch farther apart may cause the second connector to disconnect from the first connector. Movement of the first notch and the second notch farther apart may cause at least eleven pounds of force to be applied to the second connector in a direction away from the circuit board.

An example tool for disconnecting a connector from a circuit board comprises a support to maintain contact with an edge of a circuit board, and a lever attached to the support part-way along a longitudinal dimension of the tool. The lever is attached to enable the lever to pivot relative to the support. The lever is configured to engage a connector that is connected to the circuit board such that pivoting the lever causes the connector to disconnect from the circuit board. The example tool may include one or more of the following features, either alone or in combination.

The example tool may comprise a hinge to attach the lever to the support. The example tool may comprise a spring to bias the hinge. The spring may be wound around the hinge and may include fingers that contact, to bias, at least one of the lever or the support. The support and the lever may align longitudinally, and the hinge may be located partway along the lever and the support. The connector may be is a sub-miniature push-on (SMP) connector. Pivoting may include applying a force of at least eleven pounds to disconnect the connector from the circuit board.

Any two or more of the features described in this specification, including in this summary section, can be combined to form implementations not specifically described herein.

The tool described herein can be used to disconnect a connector from any apparatus or electronic system.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein are example implementations of a tool for disconnecting a connector from a circuit board and thereby removing a cable from the circuit board. Example implementations of the tool are described in the context of a sub-miniature push-on (SMP) connector. For example, the tool may be used to remove an SMP connector from a mating, receptacle connector. In this regard, an SMP connector connects to the receptacle connector through force. For example, to create the connection, the SMP connected is pushed into the receptacle connector. The resulting physical connection creates an electrical connection that allows electrical signals to flow between the circuit board and the cable. However, the tool is not limited to use with SMP connectors.

The tool may be used with connectors other than SMP connectors that connect through force to mating, receptacle connectors.

An example tool includes a base arm comprising a first handle and a first notch. The first notch is for engaging a receptacle connector connected to the circuit board. The base arm provides support against the circuit board and generally remains stationary during use of the tool. The example tool also includes a lever arm comprising a second handle and a second notch. The second notch is for engaging a groove in an SMP connector connected to the cable. A hinge connects the base arm to the lever arm. In some implementations, the hinge is biased so that, when the tool is not in use, the two handles are apart while the two notches are in contact. The lever arm is configured to pivot towards the base arm. This motion causes the two handles to come closer together, but also causes the two notches to separate and to move farther apart. For example, the lever arm notch connected to the SMP connector moves away from the base arm notch. This separation forces the SMP connector to disengage from the receptacle connector, thereby removing the cable from the circuit board.

Figure 1:
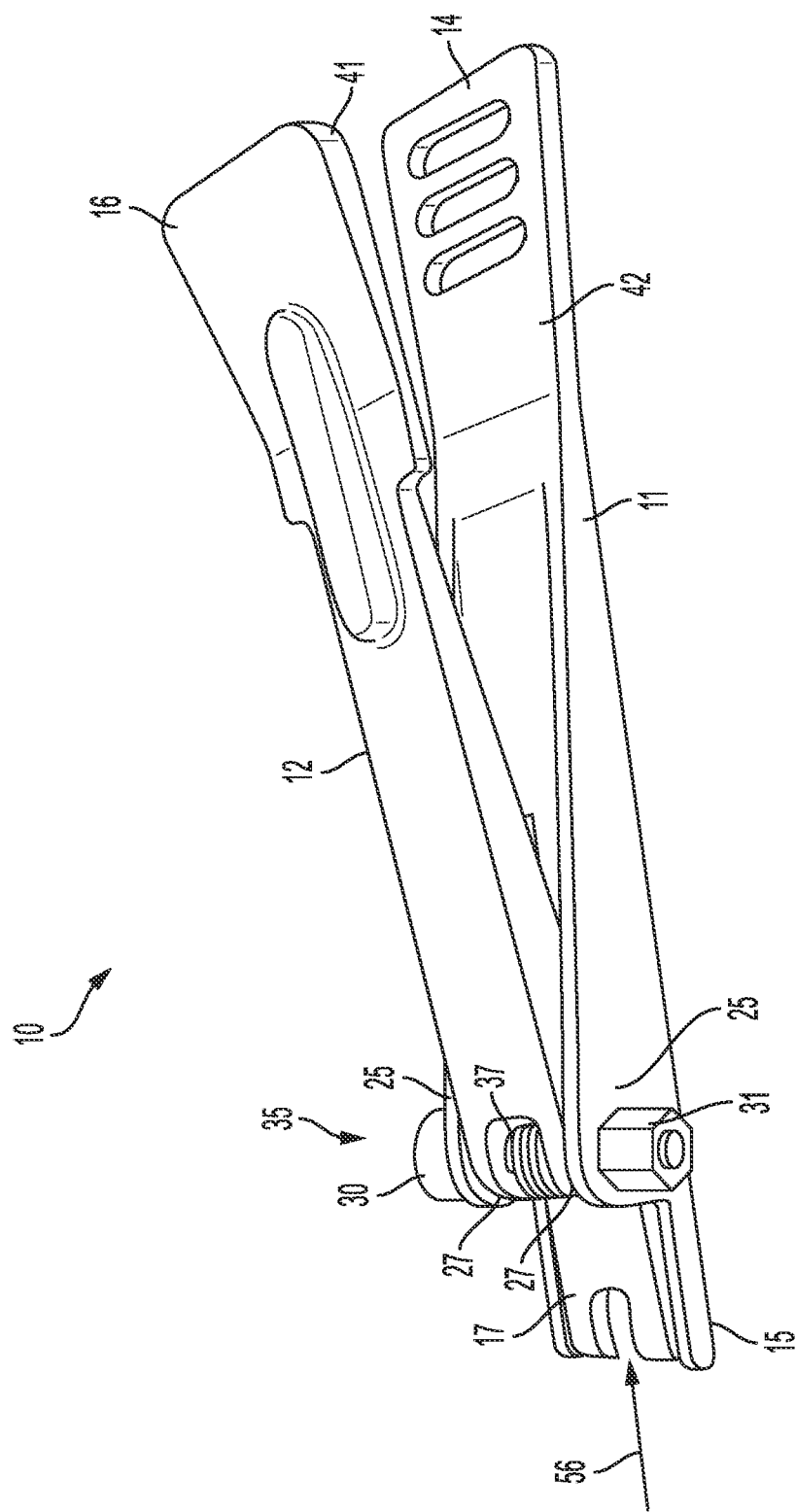
FIG. 1 is a perspective view of an example tool for disconnecting a connector from a circuit board and thereby removing a cable from the circuit board.
Figure 2:
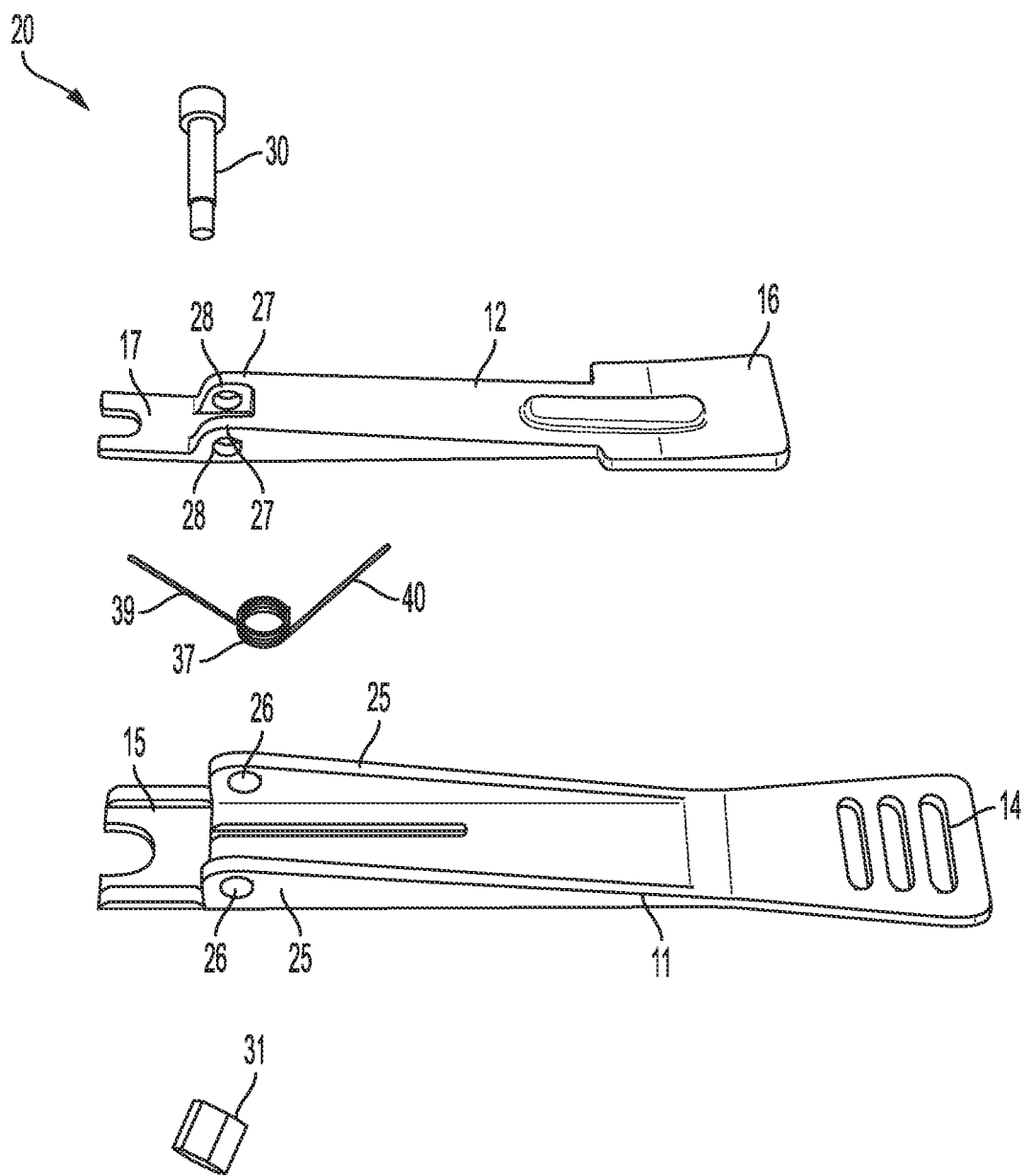
FIG. 2 is a perspective view of components of the example tool of FIG. 1.

FIG. 1 shows a perspective view of an example implementation of the tool described in the preceding paragraph. Tool 10 includes two arms: a base arm 11 and a lever arm 12. Base arm 11 includes a handle 14 and a notch piece (or simply "notch") 15. Lever arm 12 also includes a handle 16 and a notch 17. FIG. 2 shows example components 20 of tool 10 disassembled and separated.

Figure 3:
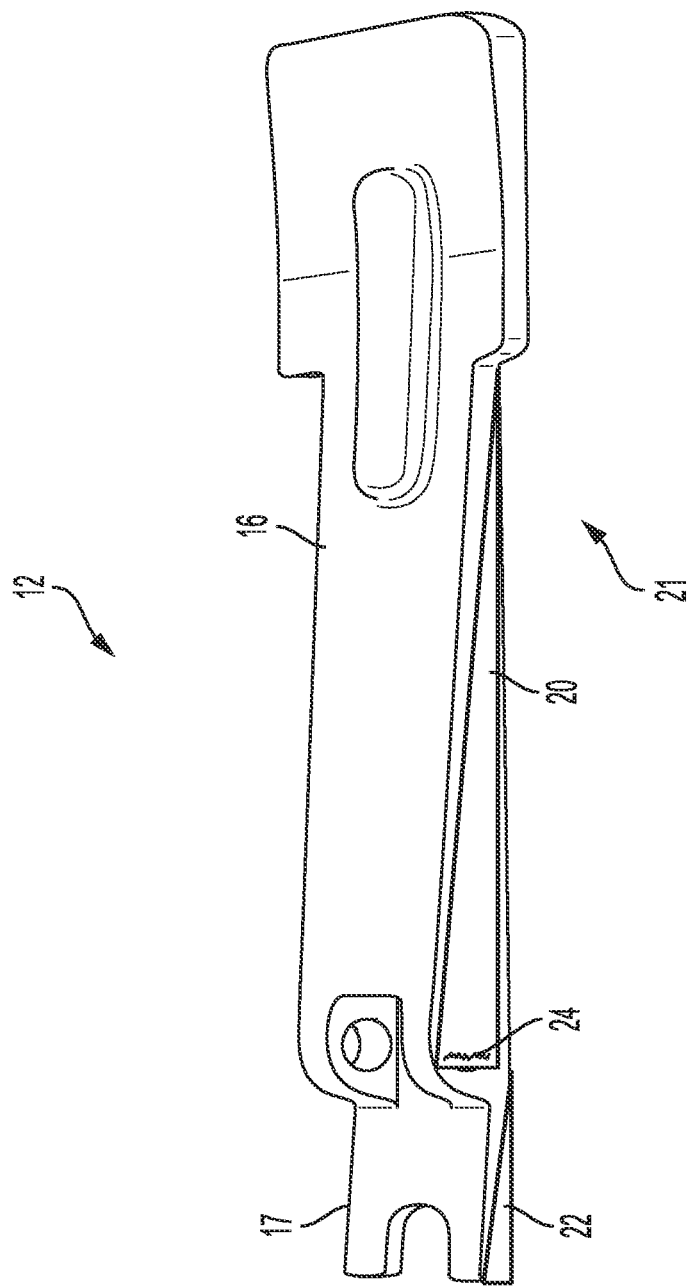
FIG. 3 is a perspective view of a lever arm of the example tool of FIG. 1.

As shown in FIGS. 1 and 2, in base arm 11, handle 14 and notch 15 are generally within the same plane. That is, notch 15 is not angled relative to handle 14. By contrast, in lever arm 12, handle 16 and notch 17 are not within the same plane. That is, handle 16 is angled and offset relative to notch 17. For example, as shown in FIG. 3, part of handle 16 rises at an angle 20 relative to plane 21 such that, near their intersection point, handle 16 is vertically offset from notch 17. This offset is represented in FIG. 3 by dashed line 24. Notch 17, also may be slightly angled 22 relative to plane 21. When the tool is assembled, this configuration allows the notches to move in a manner that is substantially opposite to movement of the handles. For example, as the handles move farther apart, the notches move closer together. As the handles move closer together, the notches move farther apart.

Referring back to FIGS. 1 and 2, base arm 11 includes structures 25 having holes 26. Lever arm 12 also includes a structures 27 having holes 28. Base arm 11 and lever arm 12 align longitudinally, as shown in FIG. 1. This alignment causes structures 25 and 27 and their respective holes also to align. In this example, structures 27 fit within structures 25 so that the holes through all of the structures align. A shoulder screw 30 fits through holes 26 and 28 to connect the base arm and the lever arm. Other types of screws or rods may also be used to make this connection. A retaining nut 31 engages an end of the shoulder screw protruding from the aligned holes. The retaining nut holds the tool together. Structures 25, 27, shoulder screw 30, and retaining nut 31 form a hinge 35 that is located partway along lever arm 12 and base arm 11. This hinge allows lever arm 12 and base arm 11 to move relative to each other along the axis of the hinge.

A spring 37 biases the hinge so that, when the tool is not in use, handle 14 and handle 16 are farther apart than are notch 15 and notch 17. Spring 37 may be a torsion spring, for example. In the example of FIG. 1, spring 37 is wound around shoulder screw 30 longitudinally. Spring 37 includes fingers 39 and 40 (see FIG. 2) that extend from the part wound around the shoulder screw. Referring to FIG. 1, one finger contacts the face 41 of lever arm 12 facing base arm 11, and one finger contacts the face 42 of base arm 11 facing lever arm 12. The tension in the fingers caused by the wound part of the spring biases the handles apart, as shown in FIG. 1. However, because of the configuration of the arms—in particular, the angle of the lever arm—when the handles are biased open, the notches are biased closed. For example, the notches are biased so that they contact each other and are flush against each other, as shown in FIG. 1.

Figure 4:
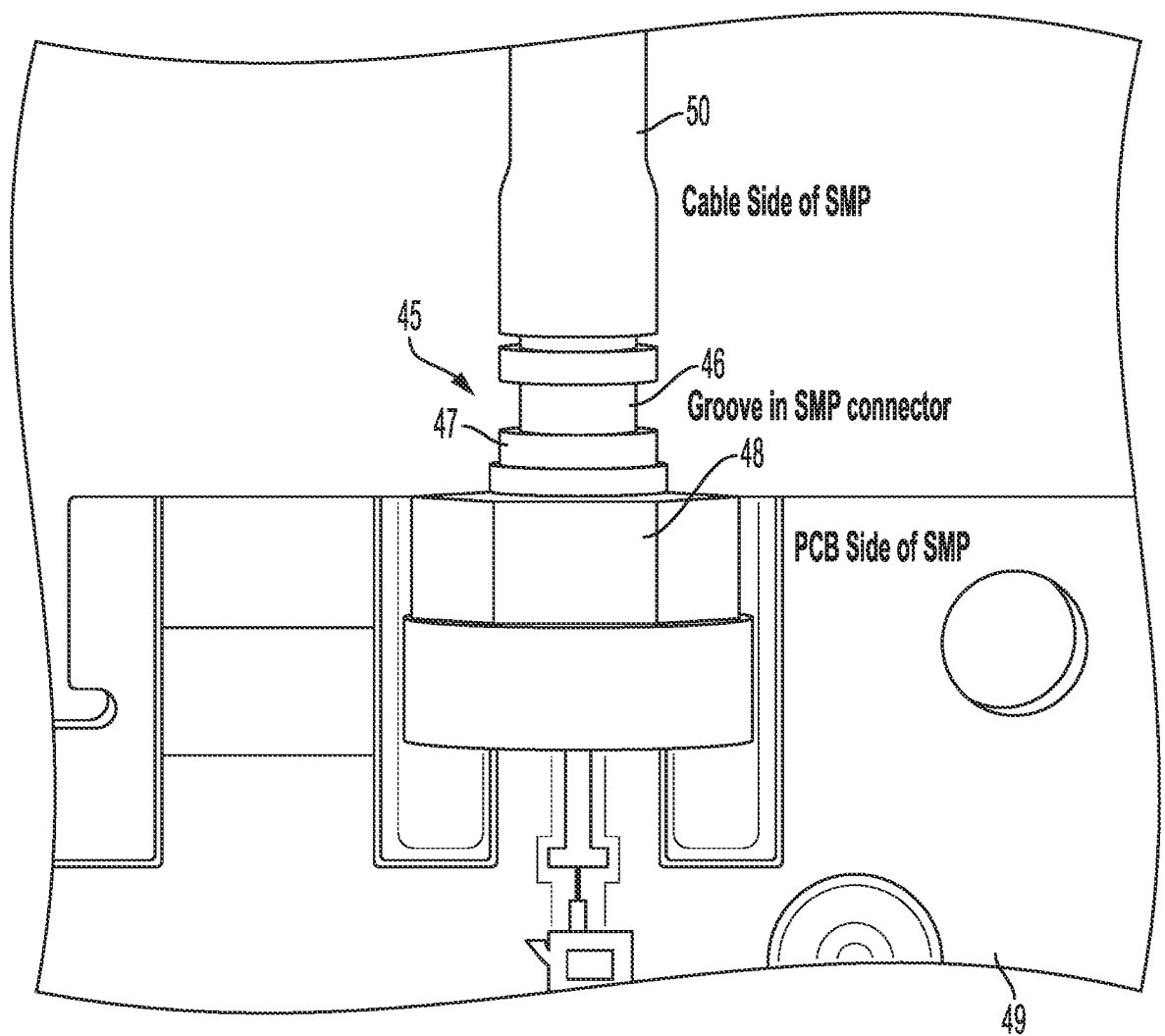
FIG. 4 is a face-on view of a sub-miniature push-on (SMP) connector connected to a mating, receptacle connector on a circuit board.

In operation, base arm 11 maintains contact with an edge of a circuit board having a receptacle connector. For example, referring to FIG. 4, SMP connector 45 includes a groove 46 adjacent to a part 47 that engages receptacle connector 48 on circuit board 49. As shown, cable 50 is connected to the SMP connector.

Figure 5:
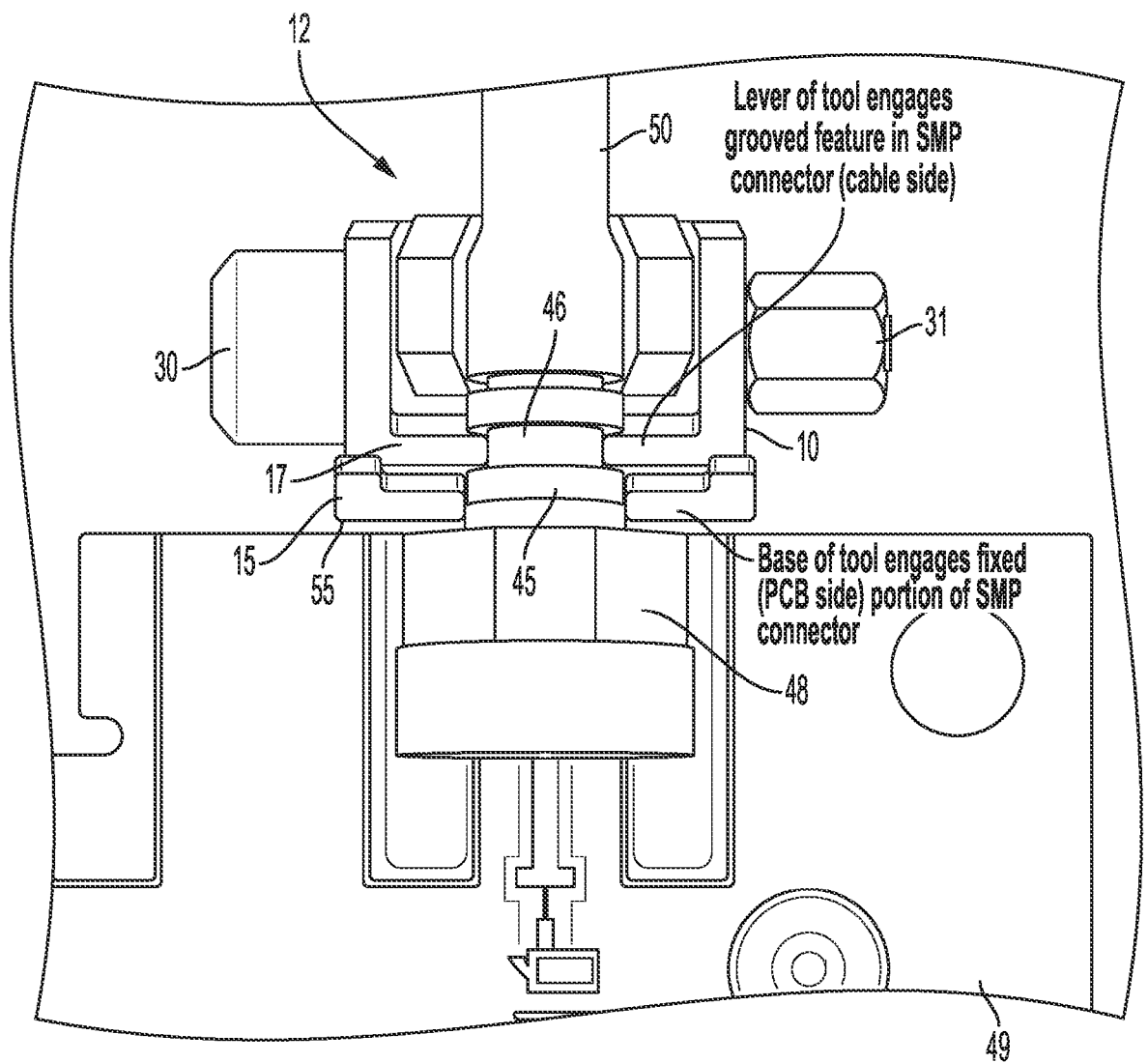
FIG. 5 is a face-on view—from the same perspective as FIG. 4—of the example tool of FIG. 1 engaging the SMP connector of FIG. 4.
Figure 6:
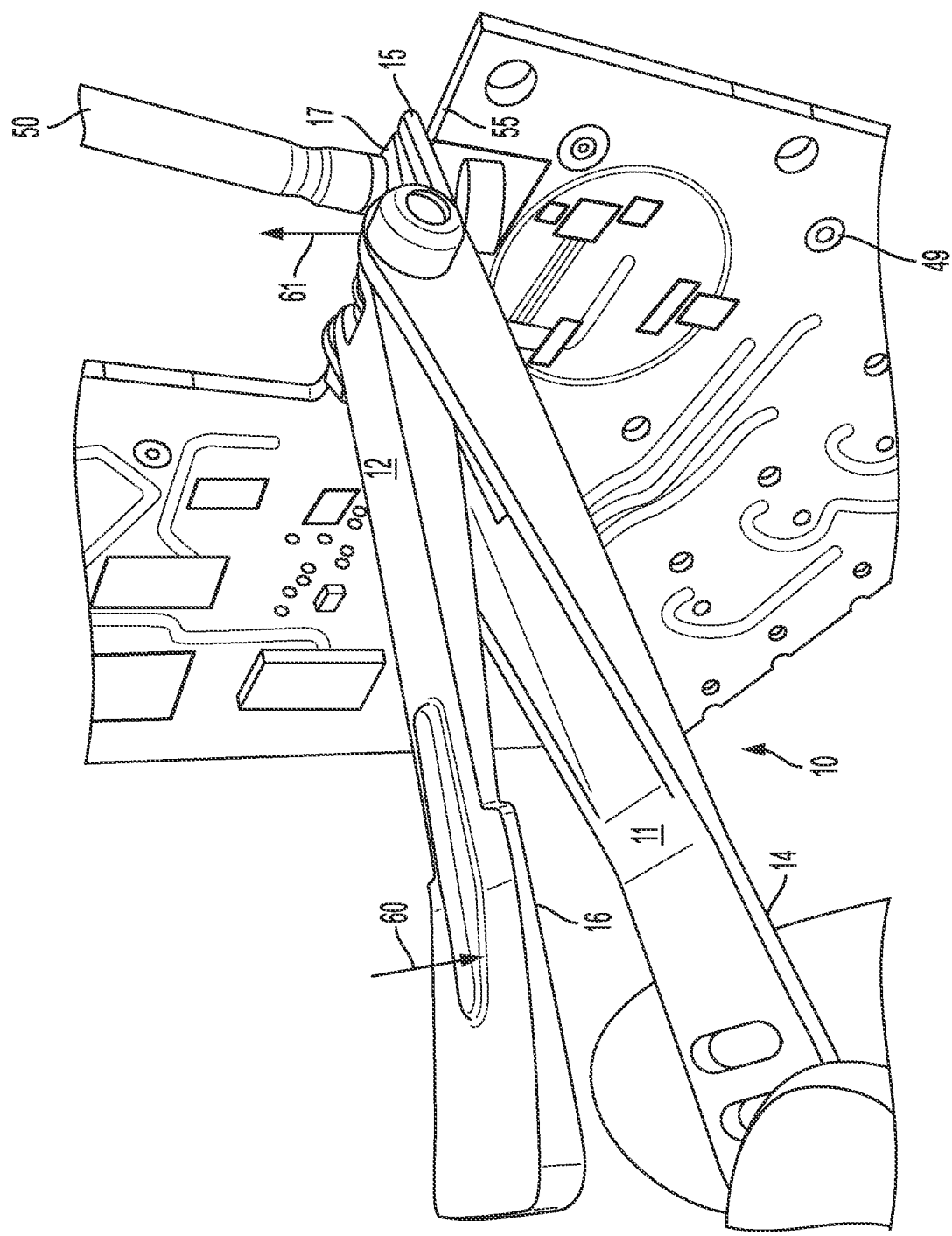
FIG. 6 is a perspective view of the example tool of FIG. 1 engaging the SMP connector of FIG. 4.

FIGS. 5 and 6 shown tool 10 being used to disconnect SMP connector 45 from circuit board 49. FIG. 5 shows the tool face-on in the direction of arrow 56 of FIG. 1. FIG. 6 shows a perspective view of the tool. Both figures do not include all of the reference numerals. Notch 15 of base arm 11 engages receptacle connector 48 such that the base arm abuts the edge 55 of circuit board 49. Base arm 11 thus remains stationary against edge 55 of circuit board 11 during operation of the tool. As explained above, lever arm 12 is attached to base arm 11 to enable the lever arm to pivot relative to base arm while the base arm remains stationary. Lever arm 12 is configured to engage SMP connector 45 that is connected to the receptacle connector 48. This engagement is such that pivoting lever arm 12 causes the SMP connector to disconnect from the receptacle connector and, thus, from the circuit board, thereby also removing the cable connected to the SMP connector from its connection to the circuit board.

More specifically in the example of FIGS. 5 and 6, notch 17 of lever arm 12 engages groove 46 of SMP connector 45, which is connected physically and electrically to receptacle connector 48 on circuit board 49. As noted notch 15 of base arm 11 engages receptacle connector 48 such that the base arm abuts the edge 55 of the circuit board. Referring also to FIG. 6, squeezing handles 14 and 16 together forces notch 17 to move away from notch 15. In some implementations, at least eleven (11) pounds of force is required to be applied to the tool in a direction of arrow 61 to cause the notches to move apart and thereby to separate the SMP connector from the circuit board. In this example, the notches moving apart includes notch 17 moving about in the direction of arrow 61, while notch 15 remains substantially stationary. The force, in the direction of arrow 60, causes SMP connector 45 to disengage from, and to move away from, its corresponding receptacle connector 48.

The mechanical configuration of the example tool provides about a four-to-one ratio of force applied to force achieved. For example, in the example of FIG. 6, between two (2) and three (3) pounds of force may be applied in the direction of arrow 60 to achieve an eleven pound (11) in the direction of arrow 61. To increase the ratio of force applied to force achieved, the length of handles 14 and 16 may be increased.

In some implementations, the tool may be made of metal. In some implementations, the tool may be made of materials other than metal, such as plastic or composite material. In some implementations, the tool may be made using three-dimensional (3D) printing. For example, components of the tool, such as the base arm and the lever arm, may be formed using 3D printing. The components may then be assembled manually or automatically using robotics or other appropriate mechanisms.

The tool described herein may be used to disconnect connectors from circuit boards, such as printed circuit boards (PCBs) included in automatic test equipment (ATE). In an example operation, ATE (also referred to as "testers" or "test systems") operates in accordance with instructions in a test program set (TPS) to automatically generate input signals to be applied to a device under test (DUT), and to monitor output signals from the DUT. The ATE compares the output signals with expected responses to determine whether the DUT is defective. Signals are delivered to PCBs in the ATE via cables having SMP connectors. The tool may be used to disengage the SMP connectors from corresponding connectors on the PCBs, thereby removing the cable from the PCB.

Figure 7:
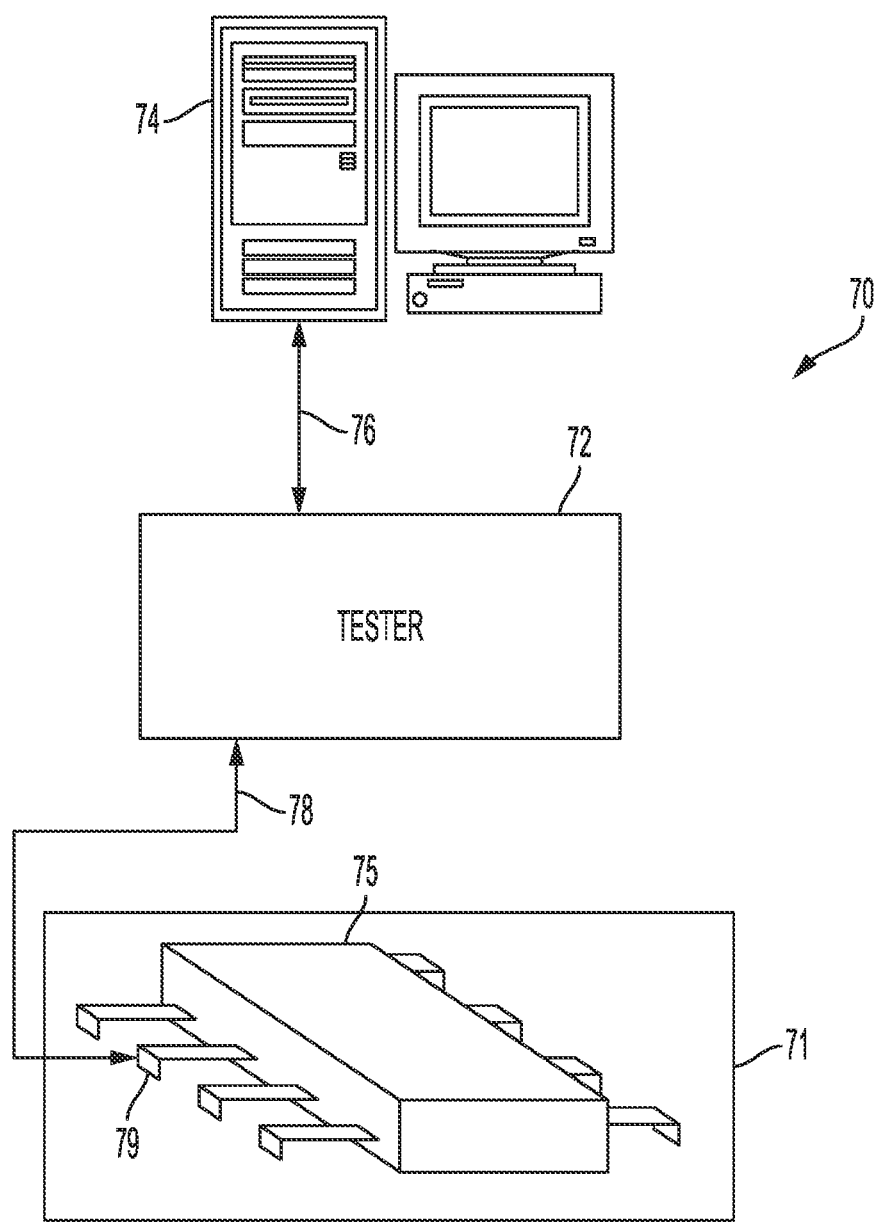
FIG. 7 is a block diagram of an example test system.

ATE typically includes a computing system and a test instrument or a single device having corresponding functionalities. Referring to FIG. 7, an example ATE system 70 for testing a DUT 75 includes a tester (or "test instrument") 72. Tester 72 may include one or more instrument modules. DUT 75 may be interfaced to a DIB 71, which may interface to the instrument modules to send signals to, and to receive signals, from the DUT.

Tester 72 may include a number of channels. To control tester 72, system 70 includes a computing system 74 that interfaces with tester 72 over a hardwire connection 76. In an example operation, computing system 74 sends commands to tester 72 to initiate execution of routines and functions for testing DUT 75. Such executing test routines may initiate the generation and transmission of test signals to the DUT 75 and collect responses from the DUT (e.g., via an instrument module). Various types of DUTs may be tested by system 70. In some implementations, the DUTs may be RF, microwave, or other wireless devices. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, tester 72 is connected to an interface to the internal circuitry of DUT 75. For example, the DUT may be inserted into a socket in DIB 71, which contains interfaces to electrical connections between the DUT and an instrument module in the tester. A conductor 78 (e.g., one or more conductive pathways) is connected to the interface and is used to deliver test signals (e.g., switching or DC test signals, etc.) to the internal circuitry of DUT 75.

Conductor 78 also senses signals in response to the test signals provided by tester 72. For example, a voltage signal or a current signal may be sensed at pin 79 in response to a test signal and sent over conductor 78 to tester 72 for analysis. Such single port tests may also be performed on other pins included in DUT 75. For example, tester 72 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 78 to pin 79 for storing a digital value on DUT 75. Once stored, DUT 75 may be accessed to retrieve and send the stored digital value over conductor 78 to tester 72. The retrieved digital value may then be identified to determine if the proper value was stored on DUT 75.

The tool described herein may be used to disconnect connectors from any appropriate PCB contained in a test system like that of FIG. 7. However, the tool is not limited to use in testing context. Rather, the tool may be used to disconnect connectors from circuit boards in any type of system containing cables connected to the circuit boards or other devices.

Any "connection" involving electrical circuitry that allows signals to flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A tool comprising:
a first arm comprising first handle and a first part having a first notch, the first notch for engaging a first connector connected to a circuit board;
a second arm comprising a second handle and a second part having a second notch, the second notch for engaging a second connector connected to a cable; and
a hinge to connect the first arm to the second arm;
wherein the hinge is biased so that, when the tool is not in use, the first handle and the second handle are apart and also the first part and the first notch are flush against the second part and the second notch.

2. The tool of claim 1, further comprising:
a spring to bias the hinge.

3. The tool of claim 2, wherein the spring is wound around the hinge and includes fingers that contact, to bias, the first arm and the second arm.

4. The tool of claim 1, wherein the first handle and the second handle align longitudinally, and the hinge is located partway along the first arm and the second arm.

5. The tool of claim 1, wherein the hinge is between the first handle and the first notch and between the second handle and the second notch.

6. The tool of claim 1, wherein the second notch is configured to engage a groove in the second connector.

7. The tool of claim 1, wherein the first part is configured to remain flush against an edge of the circuit board when the first notch engages the first connector.

8. The tool of claim 1, wherein the first arm and the second arm comprise structures containing holes that align; and
wherein the hinge comprises a shoulder screw and a retaining nut, the shoulder screw for fitting within the holes and the retaining nut for engaging the shoulder screw.

9. The tool of claim 1, wherein the hinge is biased so that, when the tool is in use, the first handle and the second handle move closer together and the first notch and the second notch move farther apart.

10. The tool of claim 9, wherein movement of the first notch and the second notch farther apart causes the second connector to disconnect from the first connector.

11. The tool of claim 9, wherein movement of the first notch and the second notch farther apart causes at least eleven pounds of force to be applied to the second connector in a direction away from the circuit board.

12. The tool of claim 1, wherein the tool comprises metal that is produced by a three-dimensional printing process.

13. A tool comprising:
  a support to maintain contact with an edge of a circuit board; and
  a lever attached to the support part-way along a longitudinal dimension of the tool, the lever being attached to enable the lever to pivot relative to the support, the lever comprising a notch to engage a connector that is connected to the circuit board such that pivoting the lever causes the connector to disconnect from the circuit board;
  wherein, when the tool is not in use, the hinge is biased so that the lever and the notch are flush against the support.

14. The tool of claim 13, further comprising:
  a hinge to attach the lever to the support.

15. The tool of claim 14, further comprising:
  a spring to bias the hinge.

16. The tool of claim 15, wherein the spring is wound around the hinge and includes fingers that contact, to bias, at least one of the lever or the support.

17. The tool of claim 14, wherein the support and the lever align longitudinally, and the hinge is located partway along the lever and the support.

18. The tool of claim 14, further comprising:
  a first handle connected to the support; and
  a second handle connected to the lever;
  wherein the hinge is biased so that, when the tool is in use, the lever and the support move farther apart while the first handle and the second handle move closer together.

19. The tool of claim 13, wherein the connector is a sub-miniature push-on (SMP) connector.

20. The tool of claim 13, wherein pivoting applies a force of at least eleven pounds to disconnect the connector from the circuit board.

* * * * *